United States Patent [19]

Kuo

[11] 4,384,399

[45] May 24, 1983

[54] METHOD OF MAKING A METAL PROGRAMMABLE MOS READ ONLY MEMORY DEVICE

[75] Inventor: Chang-Kiang Kuo, Houston, Tex.

[73] Assignee: Texas Instruments Incorporated, Dallas, Tex.

[21] Appl. No.: 890,556

[22] Filed: Mar. 20, 1978

[51] Int. Cl.³ ............................................. H01L 21/265
[52] U.S. Cl. .................................. 29/571; 29/577 R; 29/577 C; 29/578
[58] Field of Search ................... 29/571, 577, 577 IC, 29/578, 592

[56] References Cited

U.S. PATENT DOCUMENTS

| | | | |
|---|---|---|---|
| 3,641,661 | 2/1972 | Canning | 29/577 IC |
| 3,914,855 | 10/1974 | Chevey | 29/571 |
| 4,075,754 | 2/1978 | Cook | 29/571 |
| 4,151,020 | 4/1979 | McElroy | 29/577 R |
| 4,230,504 | 10/1980 | Kuo | 29/571 X |
| 4,268,950 | 5/1981 | Chutterjee et al. | 29/571 |
| 4,290,184 | 9/1981 | Kuo | 29/571 |
| 4,326,329 | 4/1982 | McElroy | 29/571 |

*Primary Examiner*—G. Ozaki
*Attorney, Agent, or Firm*—John G. Graham

[57] ABSTRACT

A metal-gate MOS read only memory or ROM array is formed by a process compatible with N-channel silicon gate manufacturing methods for circuits peripheral to the array on the same chip. The ROM is programmed at the time the metal level of contacts and interconnections, is patterned. Address lines and gates are metal in the array, and output and ground lines are defined by elongated N+ regions. Each potential MOS transistor in the array is programmed to be a logic "1" or "0" by patterning the metal to cover the gate or not. After metal patterning, the array is ion implanted through exposed gate oxide in the gates not covered by metal so that degradation is prevented.

2 Claims, 11 Drawing Figures

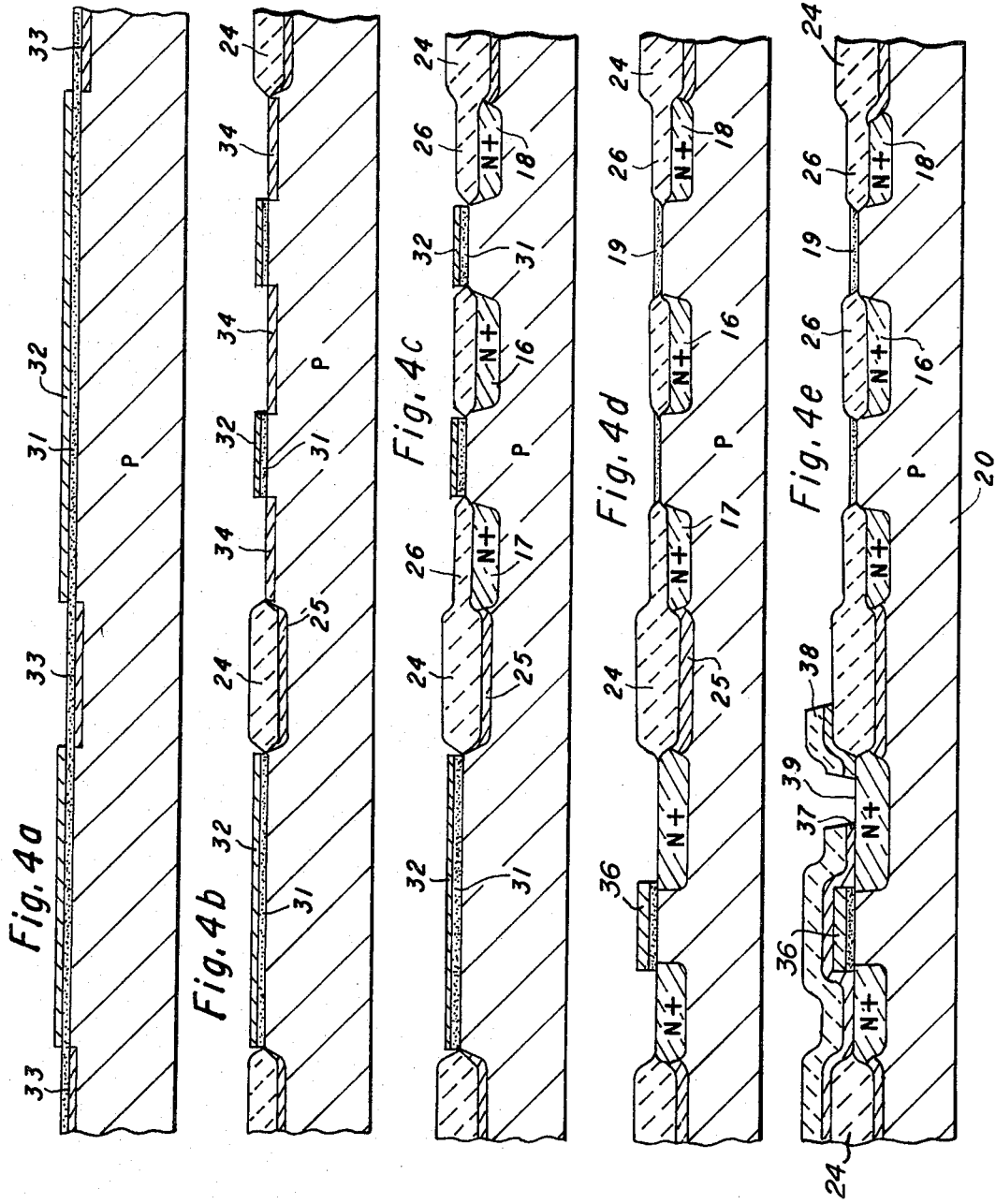

METHOD OF MAKING A METAL PROGRAMMABLE MOS READ ONLY MEMORY DEVICE

BACKGROUND OF THE INVENTION

This invention relates to semiconductor memory devices, and more particularly to an MOS read only memory programmable by metal patterning and a process for making such devices.

Semiconductor memory devices are widely used in the manufacture of digital equipment such as minicomputers and microprocessor systems. Storage of fixed programs is usually provided in these systems by MOS read only memory devices or "ROMs". ROMs are made by semiconductor manufacturers on special order, the programming code being specified by the customer. The manufacturing process is lengthy, requiring dozens of steps, each taking up time and introducing materials handling and inventor factors. Customers require the turn-around time or cycle time between receipt of the ROM code for a custom order and delivery of finished parts to be kept as short as possible. For this reason, programming should be done late in the manufacturing process, but previous ways of doing this required large cell size. The economics of manufacture of ROMSs, and of mounting them on circuit boards in the system, are such that the number of memory bits per semiconductor chip is advantageously as high as possible. ROMs of up to 32K bits (32768) are typical at present. Within a few years, standard sizes will progress through 64K, 128K, 256K and 1 megabit. This dictates that cell size for the storage cells of the ROM be quite small. P-channel ROMs of small size can be relatively easily fabricated in the manner set forth in U.S. Pat. No. 3,541,543, assigned to Texas Instruments, but usually these are programmed by the gate level mask which is at an early stage in the process. Most microprocessor and computer parts are now made by the N-channel silicon gate process because of the shorter access times provided. In the past, the N-channel process has not been favorable to layout of ROM cells of small size and/or programming has been by the moat mask, also early in the process. N-channel ROMs are disclosed in prior applications Ser. No. 762,612, filed Jan. 29, 1977, and now U.S. Pat. No. 4,151,020, and Ser. No. 701,932, filed July 1, 1976, now abandoned, assigned to Texas Instruments. A method of programming a ROM by ion implant prior to forming the polysilicon gate is shown in U.S. Pat. No. 4,059,826 to Gerald D. Rogers, assigned to Texas Instruments. Also, previous cells have been programmed at the metal level mask by contact areas between metal lines and polysilicon gates, or by contacts between metal lines and N+ source or drain regions, using excessive space on the chip for the contact definition, which is still three mask levels from completion of the slice processing. In prior U.S. Pat. No. 4,061,506, issued to David J. McElroy and assigned to Texas Instruments, a P-channel ROM is shown which uses ion implant to correct for the effects of exposed gate oxide caused by misalignment of metallization mask.

It is the principal object of this invention to provide a semiconductor permanent store memory cell of small size which may be programmed at a late stage in the manufacturing process. Another object is to provide a small-area MOS ROM cell which is made by a process compatible with standard N-channel silicon gate manufacturing techniques and is programmable at the time the metal interconnections are patterned. Also, the peripheral transistors and other circuitry may be formed by metal gate rather than silicon gate; this would be a simpler process.

SUMMARY OF THE INVENTION

In accordance with an embodiment of the invention, a metal-oxide-semiconductor read only memory, or MOS ROM, is formed in an integrated circuit along with other transistors for the peripheral circuitry. The ROM is an array of potential MOS transistors where metal strips on a silicon bar define the address lines and gates, and output and ground lines are defined by elongated N+ regions. In the array, each potential MOS transistor is a storage cell, each cell being programmed to store a logic "1" or "0" by patterning the metal strips to either cover the gates or not cover the gates, then ion implanting through the exposed thin gate oxide. This ion implant step after the metal contacts and interconnects for the array and peripheral circuitry have been patterned prevents the charge spread effect from changing the conductivity of transistors having exposed gate oxide.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIGS. 4a-4e are elevation views in section of the ROM array and a transistor in the peripheral part of the semiconductor device of FIGS. 1 and 3a-3d, at successive stages in the manufacturing process, taken generally along the line a—a in FIG. 1.

DETAILED DESCRIPTION OF SPECIFIC EMBODIMENTS

Figure 1:
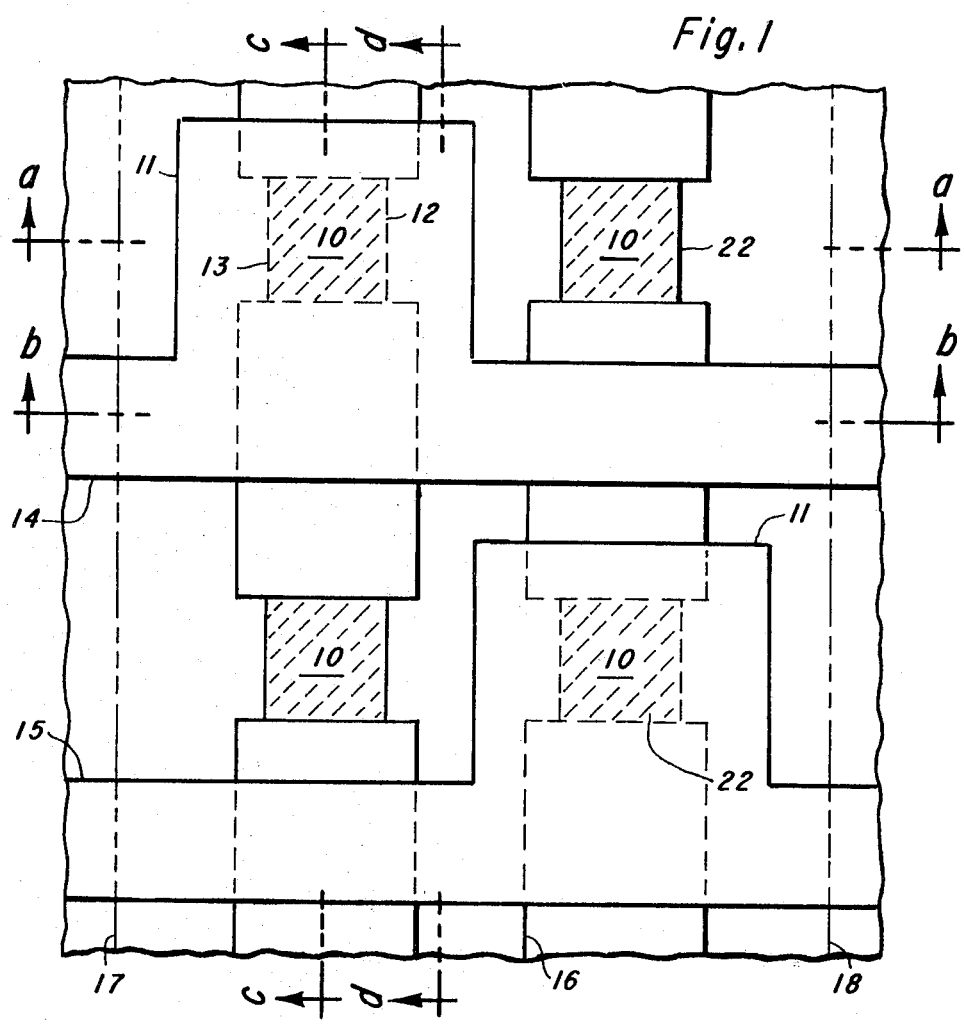
FIG. 1 is a greatly enlarged plan view of a small portion of a semiconductor chip showing the physical layout of a part of a ROM array made according to the invention.
Figure 2:
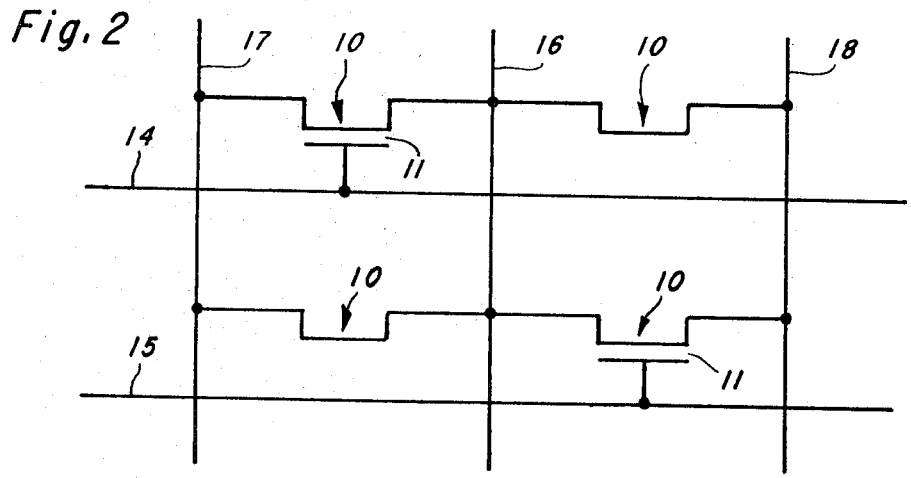
FIG. 2 is an electrical schematic diagram of the ROM of FIG. 1.
Figure 3A:
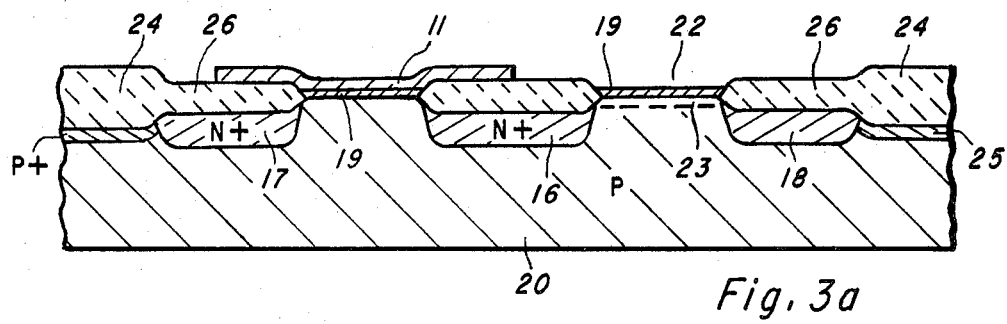
FIGS. 3a-3d are elevation views in section of the cell of FIG. 1, taken along the lines a—a, b—b, c—c, and d—d, respectively.
Figure 3B:
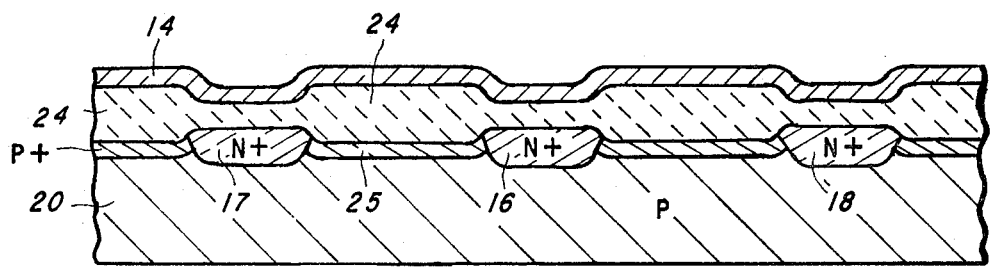
Figure 3C:
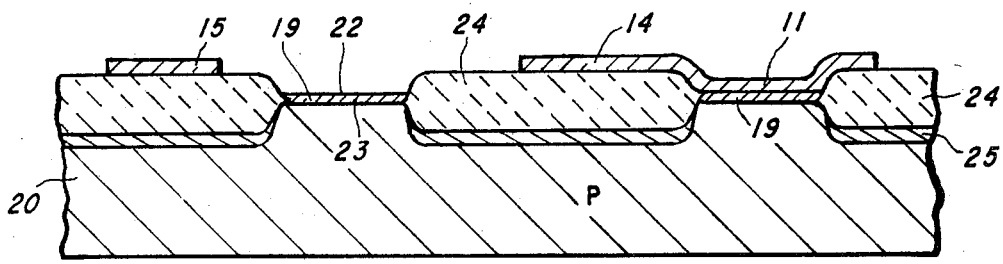
Figure 3D:
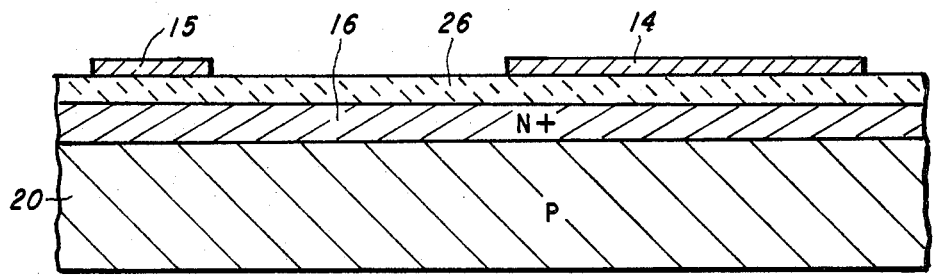

With reference to FIGS. 1, 2, and 3a-3d, a read only memory is illustrated which is programmed according to the invention. The array consists of a large number of cells 10, only four of which are shown. Each cell is a potential MOS transistor having a gate 11 (or absence of a gate), a source 12 and a drain 13. The gates 11 are parts of metal strips 14 and 15 which are the X address lines for the array. The sources are part of an N+ diffused region 16 which is connected to ground or Vss, while the drains are part of N+ diffused regions 17 and 18 which are Y output lines. The array, formed on a silicon bar 20, would typically contain perhaps 64K or 128K cells, so the bar would be no more than about 200 mils on a side or 40,000 sq. mil area depending upon the bit density. The four cells 10 shown would be on a minute part of the bar, perhaps one or two mils wide. A 64K ROM would require 256 of the X address lines such as 14 and 15 and 256 of the Y lines like the lines 17 and 18, providing 65,536 bits. Although one Vss line 16 is shown for two Y lines, the array could be of a virtual ground type as disclosed in U.S. Pat. No. 3,934,233, issued to Roger J. Fisher and Gerald D. Rogers or U.S. Pat. No. 4,021,781 issued to Edward R. Caudel both assigned to Texas Instruments, in which case one Vss line for each eight or sixteen Y lines would be all that would be needed. Alternatively, the array could be of a virtual ground type wherein no dedicated ground lines are used, but instead one Y line is selected as ground, depending upon the Y address.

The cell array is programmed by patterning the metal strips 14 and 15 to define gates 11 which cover the gate oxide 19 of selected ones of the cells 10, so these cells will be turned on by the voltage on the selected address line 14, 15, etc. In the example of four cells shown, the upper left cell and the lower right cell are formed with gates 11 in this manner, the others are not. In areas 22 where gate oxide is exposed, i.e., at the non-selected cells, problems could arise due to charge spread which would tend to turn on these transistors. An ion implant creates implanted regions 23 in the channel areas of the non-selected transistors 10. The regions 23 are doped more heavily P-type than the original silicon substrate 20, so the threshold will be much higher and degradation due to charge spread is avoided.

A thick field oxide coating 24 covers parts of the bar not occupied by the transistors or diffused interconnects, and P+ channel stop regions 25 are formed underneath all the thick field oxide. A thinner field oxide coating 26 covers the N+ diffused regions 16, 17, 18. No polysilicon lines are used in the cell array, only in the peripheral areas.

Turning now to FIGS. 4a–4e, a process for making the ROM array of the invention will be described. The right hand side of these FIGS. corresponds to the section view of FIG. 3a, while the left hand side shows the formation of an N-channel silicon gate transistor of conventional form on the periphery of the chip, i.e., not in the cell array. The starting material is a slice of P-type monocrystalline silicon, typically 3 inches in diameter and twenty mils thick, cut on the —100— plane, of a resistivity of about 6 to 8 ohm-cm. As above, in the figures the portion shown of the bar 20 represents only a very small part of the slice, perhaps 1 or 2 mils wide for each part. After appropriate cleaning, the slice is oxidized by exposing to oxygen in a furnace at an elevated temperature of perhaps 1100 degrees C. to produce an oxide layer 31 over the entire slice of a thickness of about 1000 Angstroms. Parts of this layer 31 may stay in place to become the gate insulator areas 19, but usually the layer is later removed and new gate oxide grown. Next, a layer 32 of silicon nitride of about 1000 Angstroms thickness is formed over the entire slice by exposing to an atmosphere of silane and ammonia in an rf plasma reactor. A coating of photoresist is applied to the entire top surface of the slice, then exposed to ultraviolet light through a mask which defines the desired pattern of the thick field oxide 24 and the P+ channel stop 25. The resist is developed, leaving areas where nitride is then etched away by a nitride etchant, removing the exposed part of the nitride layer 32 but leaving in place the oxide layer 31; the nitride etchant does not react with the photoresist.

Using photoresist and nitride as a mask, the slice is now subjected to an ion implant step to produce the channel stop regions 25, whereby boron atoms are introduced into unmasked regions 33 of silicon. The oxide layer 31 is left in place during the implant because it prevents the implanted boron atoms from out-diffusing from the surface during subsequent heat treatment. This implant is at a dosage of about $10^{13}$ per sq. cm at 150 KeV. The regions 33 do not exist in the same form in the finished device, because some of this part of the slice will have been consumed in the field oxidation procedure. Usually the slice would be subjected to a heat treatment after implant but prior to field oxide growth, as set forth in U.S. Pat. No. 4,055,444, assigned to Texas Instruments.

The next step in the process is formation of field oxide 24, which is done by subjecting the slices to steam or an oxidizing atmosphere at about 900 degrees C. for perhaps five hours. This causes a thick field oxide region or layer 24 to be grown as seen in FIG. 4b. This region extends into the silicon surface because silicon is consumed as it oxidizes. The remaining parts of the nitride layer 32 mask oxidation. The thickness of this layer 24 is about 6000 Angstroms, about half of which is above the original surface and half below. The boron doped P+ regions 33 formed by implant will be partly consumed, but will also diffuse further into the silicon ahead of the oxidation front. Thus, P+ field stop regions 25 will result which will be much deeper than the original regions 33. At this point, the field oxide layer 24 is not nearly as thick as it will be in the finished device. Additional thickness results from subsequent heat treatments.

The slice is now coated with another photoresist layer and then exposed to ultraviolet light through a mask which defines the source and drain areas 12 and 13 as well as the lines 16, 17 and 18 which are to be N+ diffused. After developing the slice is again subjected to a nitride etchant which removes the parts of the nitride layer 32 now exposed by holes in the photoresist. The parts of the oxide layer 31 exposed when this nitride is removed are then etched to expose bare silicon. A phosphorus diffusion produces the N+ regions 34 which will subsequently become the sources, drains, etc. Instead of diffusion, these N+ regions 34 may be formed by ion implant, in which case the oxide layer 31 would be left in place and an anneal step used before the subsequent oxidation.

Referring to FIG. 4c, a second field oxidation step is now performed by placing the slice in steam or dry oxygen at about 1000 degrees C. for several hours. This oxidizes all of the top of the slice not covered by the remaining parts of the nitride layer 32, producing field oxide 26 which is about 5000 Angstroms thickness. During this oxidation, the areas of field oxide 24 grow thicker, to perhaps 10,000 Angstroms. The N+ regions 34 are partly consumed but also diffuse further into the silicon ahead of the oxidation front to create the heavily doped regions 12, 13, 16, 17 and 18.

Next the remaining nitride layer 32 is removed by an etchant which attacks nitride but not silicon oxide; then the oxide 31 is removed by etching and the exposed silicon cleaned. The gate oxide 19 is grown by thermal oxidation to a thickness of about 800 to 1000 Angstroms. In areas of the slice where depletion load devices are required, although not pertinent to this invention, a masked ion implant step would be done at this point. Likewise, the threshold voltage of the enhancement mode transistors in the ROM array or periphery may be adjusted by ion implant. Also, windows for polysilicon to silicon contacts, if needed, are patterned and etched at this point using photoresist; none are needed in the ROM array itself or the peripheral transistor shown.

A layer of polycrystalline silicon is next deposited over the entire slice in a reactor using standard techniques, the thickness being about 5000 Angstroms. This layer is doped with phosphorus by the later N+ diffusion to make it highly conductive. The polysilicon layer is patterned by applying a layer of photoresist, exposing to ultraviolet light through a mask prepared for this purpose, developing, then etching both photoresist and exposed oxide. The remaining photoresist masks certain areas of the polysilicon to define the gates of peripheral silicon-gate transistors, connections to contacts and other such parts of the circuit on the chip. The unmasked polycrystalline silicon is etched away, so the resulting structure seen in FIG. 4d includes a part of the remaining polysilicon layer which provides what will be a gate 36 of an N-channel MOS transistor, as well as other interconnections and gates not shown. The thin oxide 19 underneath the gate 36 is the gate oxide of the transistor.

As will be seen in FIG. 4e, the next step in the process is deposition of a thin silicon nitride coating 37. This will be needed in subsequent processing to prevent unwanted etching. A thick layer 38 of silicon oxide is deposited by decomposition of silane at a low temperature, about 400 degrees C. This layer 38 insulates the metal level from the polycrystalline silicon level of interconnections, and is referred to as multilevel oxide.

Referring to FIG. 4e, the multilevel oxide layer 38 and its underlying nitride layer 37 are now patterned by a photoresist operation, exposing the entire ROM array area, as well as a contact area 39 for a metal-to-silicon contact. These are of course merely illustrative; metal contacts and interconnections are used in the periphery of the chip in the input buffers, decoders, sense amplifiers, substrate pump, and the like, as well as for the bonding pads which provide connection to external electrodes, so various metal-to-poly and metal-to-silicon contacts will be used.

The metal contacts and interconnections and metal gates and address lines in the ROM array are next formed in the usual manner by depositing a thin film 40 of aluminum over the entire top surface of the slice. Up to this point in the process all slices are exactly the same as no programming has been done in the ROM array. The slices are processed routinely to this stage with no requirement for separate inventory controls and separate identification of each lot. An inventory of slices finished up through metal deposition may be maintained for quick response to custom orders for ROM codes.

In accordance with the primary feature of the invention, referring to FIG. 4f, the ROM array is programmed by patterning the metal film 40 by a photoresist mask and etch sequence using a unique mask which defines the ROM code. An aperture open area leaving exposed gate oxide 22 is defined over each cell 10 to be programmed as a "0", and each cell 10 to be a "1" is left covered by metal to provide a gate 11 for the transistor. The slice is then subjected to a boron implant at about 50 KeV to a dosage of about $10^{13}$ per sq. cm. The energy level and dosage are dependent upon the thicknesses of the oxide layer 19 and the change in threshold desired. At this level, the ion implant penetrates the gate oxide 19 in exposed areas 22 to create an implanted region 23 in the channel area. This implant raises the threshold voltage high enough so that charge spread in this area will not turn on the stateless "transistor". The transistors covered by the metal gates 11 will not be implanted so will retain the usual threshold voltage of about 0.8 V. It is important that the mask alignment for creating the gates 11 and apertures 22 for the metal removal programming is non-critical. The active channel area of the transistors has already been defined in previous processing step with thin gate oxide 19.

In operation, the X address selects one of the lines 14 or 15, or one of the other of the 256 such lines in a 64K ROM, and this selected line is held at logic 1 level or about +5 V. The remaining lines are held at Vss, logic 0. The Y address selects one of the 256 lines such as 17 and 18, and this line is connected via the Y decoder to the output. The Y lines usually would be precharged prior to an access cycle, so the selected line will conditionally discharge depending upon whether the selected bit at the intersection of the addressed X and Y lines is programmed a 1 or a 0.

The nitride coating 37 described above is for the purpose of preventing the etchant, which opens holes in the multilevel oxide 38 as described with reference to FIG. 4e, from removing parts of the oxide layer 26 in the exposed cell array area. As an alternative to the process described above wherein the nitride coating 37 is etched using the same mask as that for the multilevel oxide 38, a separate mask may be employed to remove all of the nitride coating 37 except over the cell array prior to deposition of the multilevel oxide. Or, in like manner, the nitride 37 may be patterned, prior to deposition of multilevel oxide 38, to expose only the contact areas 39 so nitride will remain in place for all of the remainder of the peripheral circuitry as well as the cell array. It is also possible to eliminate the nitride coating 37 altogether and rely upon the etch rate differential between deposited and thermal oxide; the deposited oxide etches much faster than thermally-grown oxide, so the thermal oxide in the cell array will not be disturbed a great deal.

After the implant, the slice would be annealed at a low temperature, about 450 degrees C. to cure surface damage caused by the ion implant. Fabrication of the ROM is completed by depositing a thick layer of protective overcoat, usually silicon oxide or a glaze deposited at low temperature, about 400 degrees C. by decomposition of silane. The layer is patterned to expose metal bonding pads, the slice is scribed and broken into several hundred bars each containing a 64K ROM array, for example, and the bars mounted in packages.

If the degradation due to charge spread is not catastrophic to circuit operation, the implant may not be needed in some applications. The protective overcoat layer reduces the effects of charge spread, and if this layer is thick enough, charge spread will not be as prevalent.

In place of the ROM cell structure shown, a VMOS cell can be used as illustrated in my copending application Ser. No. 890,557, now U.S. Pat. No. 4,198,663 filed herewith and assigned to Texas Instruments. Instead of programming by implant after metal patterning as disclosed, programming would be by metal patterning as described above.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is, therefore contemplated that the appended claims will cover any such modifications or embodiments as fall within the true scope of the invention.

What is claimed is:

1. A method of making a read-only memory comprising the steps of:

forming a plurality of potential insulated gate field effect transistors without self-aligned gates in a face of a semiconductor body, each of the transistors having a source, a drain and a gate insulator but not a gate, the transistors being in a regular pattern of rows and columns to provide an array of memory cells, the columns being heavily-doped elongated regions in the face integral with the sources and drains and covered by thick oxide;

forming a plurality of self-aligned silicon-gate transistors on said face peripheral to the array;

applying a coating of conductive material over the face; and programming the array of memory cells by patterning the coating to define strips which provide the rows and to define extension of the strips out over the gate insulator for selected ones of the field effect transistors, said extensions providing the gates of said selected ones of the transistors, the remaining transistors having no such extensions being nonfunctional, wherein after the step of programming the face is ion implanted to raise the threshold of non-selected transistors in the array.

2. A method according to claim 1 wherein the semiconductor body is P-type silicon, the sources and drains are N-type, and the ion implant is P-type.

* * * * *